(12) United States Patent
Kim et al.

(10) Patent No.: US 10,418,587 B2
(45) Date of Patent: Sep. 17, 2019

(54) DISPLAY DEVICE

(71) Applicant: SAMSUNG DISPLAY CO., LTD., Yongin-si, Gyeonggi-do (KR)

(72) Inventors: Min Sang Kim, Yongin-si (KR); Seung Wook Kwon, Yongin-si (KR); Oh June Kwon, Yongin-si (KR); Hyo Jeong Kwon, Yongin-si (KR); Doo Hwan Kim, Yongin-si (KR); Woo Yong Sung, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 15/870,337

(22) Filed: Jan. 12, 2018

(65) Prior Publication Data

US 2018/0358580 A1    Dec. 13, 2018

(30) Foreign Application Priority Data

Jun. 7, 2017   (KR) .......................... 10-2017-0070993

(51) Int. Cl.
  *H01L 33/00*     (2010.01)
  *H01L 21/00*     (2006.01)
  *H01L 51/52*     (2006.01)

(52) U.S. Cl.
  CPC ...... *H01L 51/5246* (2013.01); *H01L 51/5253* (2013.01); *H01L 51/5275* (2013.01)

(58) Field of Classification Search
  CPC ................................................ H01L 51/5246

USPC ............................................... 438/29; 257/98
See application file for complete search history.

(56) References Cited

U.S. PATENT DOCUMENTS 8,125,145 B2    2/2012  Fiebranz
8,330,361 B2 *  12/2012 Kim ................... H01L 51/5284
                                                    313/483
9,065,076 B2    6/2015  Lee et al.
2015/0380688 A1 12/2015 Chen et al.

FOREIGN PATENT DOCUMENTS

JP    2009522737 A    6/2009
KR    1020080064336 A 7/2008
KR    1020100073228 A 7/2010
KR    1020140123731 A 10/2014

* cited by examiner

*Primary Examiner* — Calvin Lee
(74) *Attorney, Agent, or Firm* — Cantor Colburn LLP

(57) ABSTRACT

A display device includes a substrate which includes a pixel region and a peripheral region which is provided on at least one side of the pixel region, a plurality of pixels provided in the pixel region, a passivation layer that disposed on the substrate, a light emitting element disposed on the passivation layer and which emits light, and a sealing member which covers the light emitting element. The sealing member includes a first inorganic layer disposed on the light emitting element, a lens portion disposed on the first inorganic layer and which extracts light which is emitted from the light emitting element, an organic layer disposed on the lens portion, and a second inorganic layer disposed on the organic layer.

19 Claims, 11 Drawing Sheets

DISPLAY DEVICE

This application claims priority to Korean Patent Application No. 10-2017-0070993, filed on Jun. 7, 2017, and all the benefits accruing therefrom under 35 U.S.C. § 119, the content of which in its entirety is herein incorporated by reference.

BACKGROUND

1. Field

Exemplary embodiments of the invention relate to a display device, and particularly a display device including a light emitting element.

2. Description of the Related Art

An organic light emitting display device includes an organic light emitting element, and the organic light emitting element emits light as electrons injected from one electrode and holes injected from another electrode are combined in an organic light emitting layer to form excitons and the excitons emit energy.

The organic light emitting display device may include a sealing member for blocking external oxygen and moisture from penetrating into the organic light emitting element.

The sealing member may include a plurality of inorganic films and a plurality of organic films.

SUMMARY

Exemplary embodiments of the invention are to provide a display device which can increase efficiency of light.

A display device according to an exemplary embodiment of the invention comprises a substrate which includes a pixel region and a peripheral region which is provided on at least one side of the pixel region, a plurality of pixels provided in the pixel region, a passivation layer that is disposed on the substrate, a light emitting element that is disposed on the passivation layer and which emits light, and a sealing member which covers the light emitting element. The sealing member includes a first inorganic layer disposed on the light emitting element, a lens portion disposed on the first inorganic layer and which extracts light which is emitted from the light emitting element, an organic layer disposed on the lens portion, and a second inorganic layer disposed on the organic layer.

In an exemplary embodiment of the invention, the light emitting element may include a first electrode that is disposed on the passivation layer, a light emitting layer disposed on the first electrode through an opening, defined by a pixel defining layer, through which a part of the first electrode is exposed, and a second electrode that is disposed on the light emitting layer.

In an exemplary embodiment of the invention, the lens portion may be disposed on the first inorganic layer and corresponds to the opening defined by the pixel defining layer.

In an exemplary embodiment of the invention, the display device may further include a surface modification layer disposed between the first inorganic layer and the lens portion.

In an exemplary embodiment of the invention, the surface modification layer may include a self-assembled organic material with a hydrophobic property.

In an exemplary embodiment of the invention, the lens portion may have a convex shape or a concave shape.

In an exemplary embodiment of the invention, the organic layer and the lens portion may have different refractive indices from each other.

In an exemplary embodiment of the invention, the refractive index of the organic layer may be larger than the refractive index of the lens portion or may be smaller than the refractive index of the lens portion.

In an exemplary embodiment of the invention, the lens portions may be regularly arranged on the substrate.

In an exemplary embodiment of the invention, the lens portions may be arranged to correspond to a plurality of pixels on the substrate, respectively.

In an exemplary embodiment of the invention, the lens portions may be irregularly arranged on the substrate.

In an exemplary embodiment of the invention, the lens portion may include ink containing epoxy-based resin.

In an exemplary embodiment of the invention, each of the plurality of pixels may include a thin film transistor which is provided on the substrate and may be electrically connected to the light emitting element.

In an exemplary embodiment of the invention, the thin film transistor may include a semiconductor layer disposed on the substrate, a gate electrode disposed on the semiconductor layer with a gate insulating layer interposed therebetween and a source electrode and a drain electrode connected to the semiconductor layer.

A display device according to another exemplary embodiment of the invention comprises a substrate which includes a pixel region and a peripheral region which is provided on at least one side of the pixel region, a plurality of pixels provided in the pixel region, a passivation layer disposed on the substrate, a light emitting element disposed on the passivation layer and which emits light, a pixel defining layer disposed on the passivation layer and which defines an opening which exposes a part of the light emitting element, and a sealing member which covers the light emitting element. The sealing member includes a first inorganic layer disposed on the light emitting element, a lens portion disposed on the first inorganic layer and which corresponds to the opening defined by the pixel defining layer and extracts light which is emitted from the light emitting element, an organic layer disposed on the lens portion, and a second inorganic layer disposed on the organic layer.

According to an exemplary embodiment of the invention, it is possible to provide a display device with increased efficiency of light.

DETAILED DESCRIPTION

Figure 1:
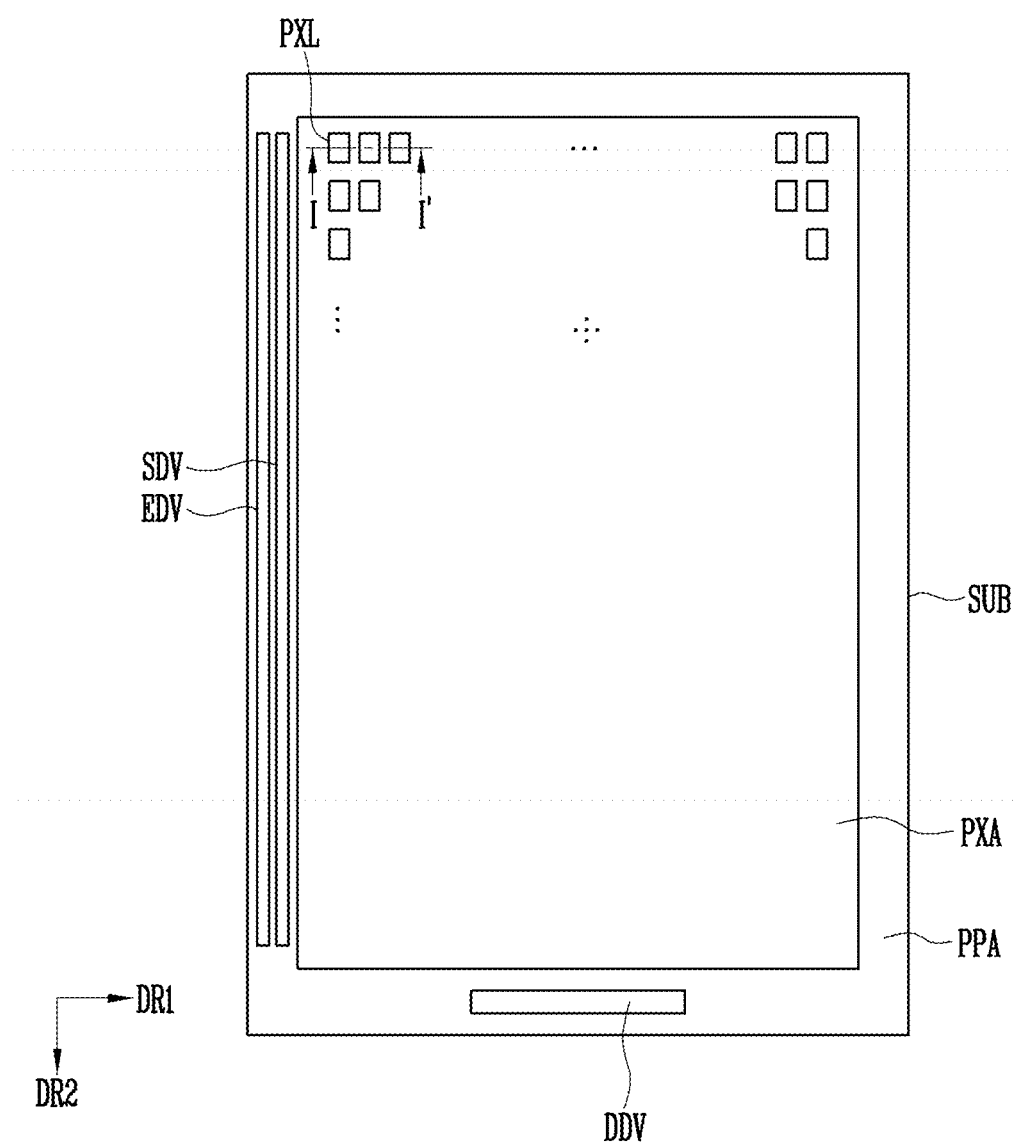
FIG. 1 is a plan view illustrating an exemplary embodiment of a display device according to the invention.

While the invention may be variously modified and may have various forms, specific embodiments thereof will be illustrated in the drawings and be hereinafter described in detail. However, it should be understood that the invention is not intended to be limited to the particular disclosure forms and covers all modifications, equivalents, and alternatives which are included in the spirit and scope of the invention.

Similar reference numerals or symbols are used for similar configuration elements in describing each drawing. In the accompanying drawings, dimensions of the structures are enlarged to be illustrated from the actual structures for the sake of clarity of the invention. The terms first, second, and the like may be used for describing various configuration elements, and the configuration elements should not be limited by the terms. The terms are used only for the purpose of distinguishing one configuration element from another configuration element. For example, a first configuration element may be referred to as a second configuration element without departing from the scope of the invention, and similarly, the second configuration element may also be referred to as the first configuration element. Singular forms include plural expressions unless otherwise described contextually and clearly.

In the present application, the term "include", "have" or the like is intended to indicate that features, numbers, steps, operations, configuration elements, components, or combinations thereof which are described in the specification exist, and it should be understood that presence or addition of one or more of other features, numbers, steps, operations, configuration elements, components, or combinations thereof are not precluded in advance. In addition, in a case where a portion such as a layer, a film, a region, a plate, or the like is described as being "on" another portion, this includes not only a case where the portion is formed "directly on" another portion, but also a case where the portion is formed over another portion through still another portion therebetween. In addition, in the present application, in a case where a portion of a layer, a film, a region, a plate, or the like is formed on another portion, a direction in which the portion is formed is not limited to an upper direction, and includes a side direction or a lower direction. In contrast to this, in a case where a portion such as a layer, a film, a region, a plate, or the like is described referred as being "under" another portion, this includes not only a case where the portion is formed "directly under" another portion, but also a case where the portion is formed under another portion through still another portion therebetween.

Hereinafter, preferred exemplary embodiments of the invention will be described with reference to the accompanying drawings in more detail.

FIG. 1 is a plan view illustrating an exemplary embodiment of a display device according to the invention.

Referring to FIG. 1, the display device according to an exemplary embodiment of the invention may include a substrate SUB, pixels PXL provided on the substrate SUB, a driver which is provided on the substrate SUB and drives the pixels PXL, and a wire portion (not illustrated) which connects the pixels PXL.

The substrate SUB includes a pixel region PXA and a peripheral region PPA. The pixel region PXA is a display area in which the pixels PXL that display an image are provided. Each pixel PXL will be described below. The peripheral region PPA is a non-display area in which no image is displayed as an area where the pixels PXL are not provided. The peripheral region PPA may be provided with a part of the driver which drives the pixels PXL and wires (not illustrated) which connect the pixels PXL to the driver. The peripheral region PPA may correspond to a bezel in the final display device, and a width of the bezel may be determined depending on a width of the peripheral region PPA.

The pixel region PXA may have various shapes. In an exemplary embodiment, for example, the pixel region PXA may be provided in various shapes such as a closed polygon having sides, a circle, an ellipse, or the like having sides configured with curved lines, and a semicircle, a semi-ellipse, or the like having sides configured with a straight line and a curved line. Hereinafter, a case where the pixel region PXA is provided as a rectangular region having straight sides will be described as an example.

The peripheral region PPA is provided on at least one side of the pixel region PXA. In the exemplary embodiment of the invention, the peripheral region PPA may surround the periphery of the pixel region PXA. The peripheral region PPA may include a horizontal portion extending in a first direction DR1 and a vertical portion extending in a second direction DR2 intersecting the first direction DR1. The vertical portion of the peripheral region PPA may be provided as one pair separated from each other along a width direction, first direction DR1, of the pixel region PXA.

The pixels PXL are provided in the pixel region PXA on the substrate SUB. Each of the pixels PXL may a minimum unit which displays an image. The pixels PXL may include display elements which emit white light and/or color light.

A plurality of pixels PXL may be arranged in a matrix form along rows extending in the first direction DR1 and columns extending in the second direction DR2. However, an arrangement form of the pixels PXL of the invention is not limited thereto, and may be may be provided in various forms. In another exemplary embodiment, for example, a part of the pixels PXL may be arranged such that the first direction DR1 is a row direction, but the other parts of the pixels PXL may be arranged in a direction other than the first direction DR1, for example, such that an oblique direction with respect to the first direction DR1 may be the row direction. Alternatively, the pixels PXL may be arranged such that an oblique direction with respect to both the first direction DR1 and the second direction DR2 is the column direction, and a direction intersecting the column direction is the row direction. Here, the column direction may also be inclined with respect to both the first direction DR1 and the second direction DR2.

The driver may include a scan driver SDV which transmits scan signals to the respective pixels PXL through a scan wire line (not illustrated), a light emitting driver which transmits light emitting control signals to the respective pixels PXL through a light emitting control line (not illustrated), a data driver DDV which transmits data signals to the respective pixels PXL through data wires (not illustrated), and a timing controller (not illustrated). The timing controller may control the scan driver SDV, the light emitting driver EDV, and the data driver DDV.

The scan driver SDV may be disposed in at least one of the vertical portions of the peripheral region PPA. The scan driver SDV may be extended along a longitudinal direction of the vertical portion of the peripheral region PPA, but the invention is not limited thereto.

In an exemplary embodiment of the invention, the scan driver SDV may be mounted directly on the substrate SUB. If the scan driver SDV is directly mounted on the substrate SUB, the scan driver SDV may be formed together with the pixels during a process of forming the pixels PXL. However, a position and a method in which the scan driver SDV is provided according to the invention are not limited thereto. In another exemplary embodiment, the scan driver may be formed in a separate chip and may be provided on the substrate SUB as a chip on glass type. The scan driver SDV may be mounted on a printed circuit board and may be connected to the substrate SUB through a connection member.

The light emitting driver EDV may also be disposed in at least one of the vertical portions of the peripheral region PPA, in a similar manner to the scan driver SDV. The light emitting driver EDV may be extended along the vertical direction of the longitudinal direction of the peripheral region PPA.

In an exemplary embodiment of the invention, the scan driver SDV and the light emitting driver EDV are adjacent to each other and, Here, a case where the scan driver SDV is disposed only in one of pairs of the vertical portions of the peripheral region PPA is illustrated as an example. The invention is not limited thereto, and the arrangement thereof may be changed in various ways.

The data driver DDV may be disposed in the peripheral region PPA. Particularly, the data driver DDV may be disposed in the horizontal portion of the peripheral region PPA. The data driver DDV may extend along a width direction, a longitudinal direction of the horizontal portion, of the peripheral region PPA.

Figure 2:
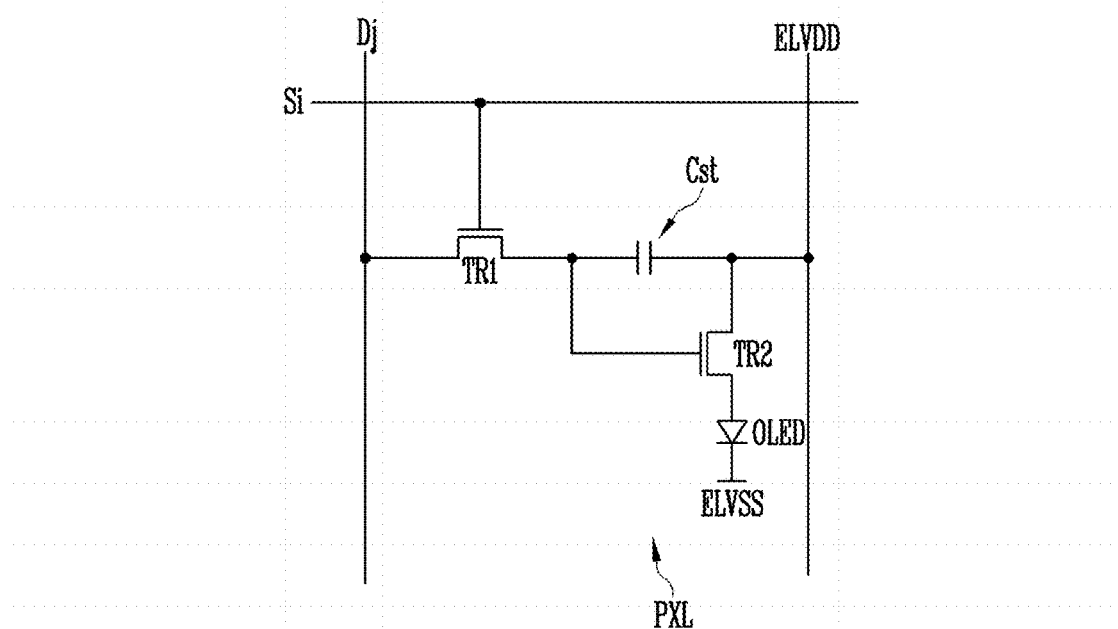
FIG. 2 is an equivalent circuit diagram illustrating an exemplary embodiment where a pixel illustrated in FIG. 1 is a light emitting element.

FIG. 2 is an equivalent circuit diagram illustrating an exemplary embodiment where the pixel illustrated in FIG. 1 is a light emitting element.

Referring to FIGS. 1 and 2, each pixel PXL may include a pixel circuit portion connected to a wire portion, and a light emitting element OLED connected to the pixel circuit portion.

The pixel circuit portion may include a driving thin film transistor TR2 for controlling the light emitting element OLED, a switching thin film transistor TR1 for switching the driving thin film transistor TR2, and a capacitor Cst connected to first and second power supply wires ELVDD and ELVSS of the wire portion.

The switching thin film transistor TR1 may include a gate electrode, a source electrode, and a drain electrode. The switching thin film transistor TR1 may have the gate electrode connected to an i-th scan line Si and the source electrode connected to a j-th data line Dj. The drain electrode of the switching thin film transistor TR1 may be connected to a gate electrode of the driving thin film transistor TR2. The switching thin film transistor TR1 may transmit a data signal received from the j-th data line Dj to the driving thin film transistor TR2 in response to a scan signal received from the i-th scan line Si.

The driving thin film transistor TR2 may include the gate electrode, a source electrode, and a drain electrode. The driving thin film transistor TR2 may have the gate electrode connected to the switching thin film transistor TR1, the source electrode connected to the first power supply line ELVDD, and the drain electrode connected to the light emitting element OLED.

The light emitting element OLED may include a light emitting layer, and an anode electrode and a cathode electrode each of which faces the light emitting layer interposed therebetween. The anode electrode may be connected to the drain electrode of the driving thin film transistor TR2. The cathode electrode may be connected to the second power supply line ELVSS such that a common voltage is applied thereto. The light emitting layer may emit light in response to an output signal of the driving thin film transistor TR2 and display an image by emitting or not emitting light. Here, the light emitted from the light emitting layer may vary depending on a material of the light emitting layer, and may be colored light or white light.

The capacitor Cst may be connected between the gate and source electrodes of the driving thin film transistor TR2, and may charge and maintain the data signal input to the gate electrode of the driving thin film transistor TR2.

An exemplary embodiment of the invention describes that the pixel circuit portion includes two thin film transistors TR1 and TR2, but the invention is not limited thereto. In another exemplary embodiment, the pixel circuit portion may include one thin film transistor and one capacitor in the pixel circuit portion, or may include three or more transistors and two or more capacitors in the pixel circuit portion.

Figure 3:
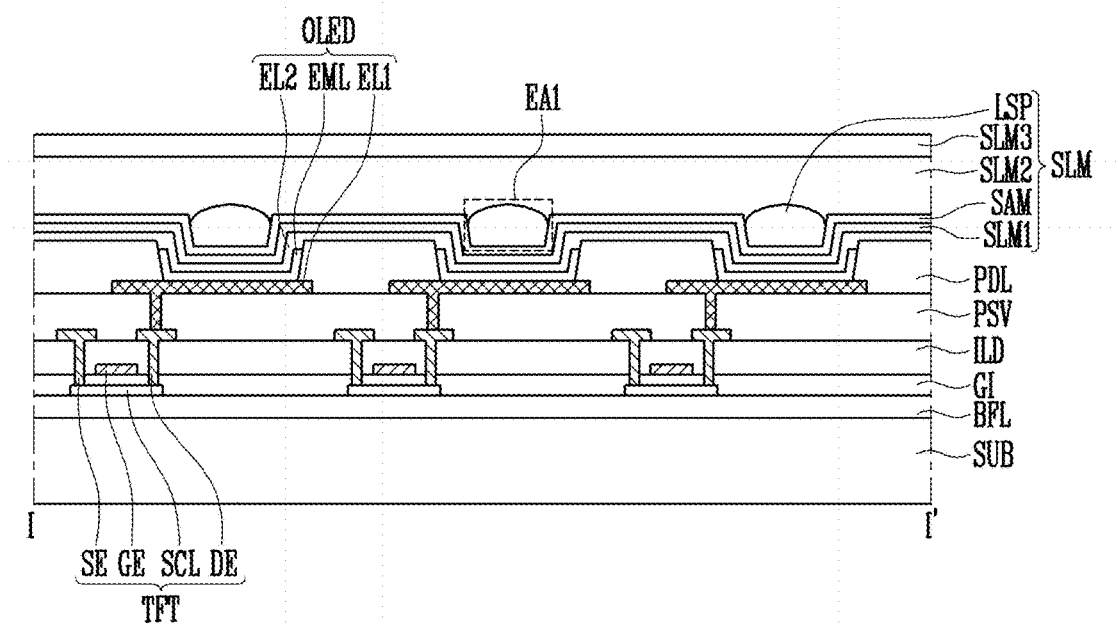
FIG. 3 is a cross-sectional view taken along a line I-I' of FIG. 1.

FIG. 3 is a cross-sectional view taken along a line I-I' of FIG. 1. For the sake of convenient description, FIG. 3 mainly illustrates one thin film transistor provided in each pixel and a light emitting element connected to the thin film transistor.

Referring to FIGS. 1 and 3, the display device according to an exemplary embodiment of the invention may include the substrate SUB, the thin film transistor TFT, the light emitting element OLED, and a sealing member SLM.

The substrate SUB may include an insulating material such as glass or resin. In addition, the substrate SUB may include a material with flexibility so as to be bent or folded, and may have a single-layer structure or a multi-layer structure.

In an exemplary embodiment, for example, the substrate SUB may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate. However, the material forming the substrate SUB may be variously changed, and may be configured by fiber reinforced plastic ("FRP") or the like.

A buffer layer BFL may be disposed between the substrate SUB and the thin film transistor TFT.

The buffer layer BFL may prevent impurities from diffusing into the thin film transistor TFT. The buffer layer BFL may be provided as a single layer, or may be provided as at least two or more layers. If the buffer layer BFL is provided in multiple layers, each layer may include the same material or different materials. The buffer layer BFL may be omitted depending on a material of the substrate SUB and process conditions.

In an exemplary embodiment of the invention, the buffer layer BFL may be an inorganic insulating film consisting of an inorganic material. In another exemplary embodiment, for example, the buffer layer BFL may include at least one of silicon nitride, silicon oxide, silicon oxynitride, or the like.

The thin film transistor TFT may be provided on the substrate SUB. In an exemplary embodiment of the invention, the thin film transistor TFT may be a driving thin film transistor connected to the light emitting element OLED to drive the light emitting element OLED. The thin film transistor TFT may include a semiconductor layer SCL, a gate electrode GE, a source electrode SE, and a drain electrode DE.

The semiconductor layer SCL may be disposed on the buffer layer BFL. The semiconductor layer SCL may include a source region and a drain region which are in contact with a source electrode SE and a drain electrode DE, respectively. A region, of semiconductor layer SCL, between the source region and the drain region may be a channel region. In an exemplary embodiment, the semiconductor layer SCL may be a semiconductor pattern configured by polysilicon, amorphous silicon, oxide semiconductor, or the like. The channel region may a semiconductor pattern which is not doped with impurities, and may be an intrinsic semiconductor. The source region and the drain region may be semiconductor patterns doped with impurities. The impurities may include n-type impurities, p-type impurities, and impurities such as metals.

The gate electrode GE may be disposed on the semiconductor layer SCL, and a gate insulating layer GI is interposed between the gate electrode GE and the semiconductor layer SCL. Here, the gate insulating layer GI may be an inorganic insulating film containing an inorganic material. In an exemplary embodiment, for example, the gate insulating layer GI may include silicon nitride, silicon oxide, silicon oxynitride, or the like.

The gate electrode GE may include at least one of metals, such as gold (Au), silver (Ag), aluminum (Al), molybdenum (Mo), chromium (Cr), titanium (Ti), nickel (Ni), neodymium (Ne), and copper (Cu), or an alloy of the metals. In addition, the gate electrode GE may consist of a single layer, but the invention is not limited thereto, and may consist of multiple layers in which at least two or more of the metals and the alloys are laminated.

The source electrode SE and the drain electrode DE may be respectively connected to a source region and a drain region of the semiconductor layer SCL through contact holes passing through an interlayer insulating layer ILD and the gate insulating layer GI. The interlayer insulating layer ILD may be an inorganic insulating film consisting of an inorganic material or an organic insulating film including an organic material.

In an exemplary embodiment, each of the source electrode SE and the drain electrode DE may include at least one of metals such as gold (Au), silver (Ag), aluminum (Al), molybdenum (Mo), chromium (Cr), nickel (Ni), neodymium (Cu), and copper (Cu), or an alloy of the metals. In addition, the source electrode SE and the drain electrode DE may consist of a single layer but the invention is not limited thereto, and may consist of multiple layers in which at least two or more of the metals and the alloys are laminated. The source electrode SE and the drain electrode DE may be disposed to be separated from each other on the interlayer insulating layer ILD.

The source electrode SE may be in contact with the source region of the semiconductor layer SCL through a contact hole sequentially passing through the interlayer insulating layer ILD and the gate insulating layer GI. The drain electrode DE may also be in contact with the drain region of the semiconductor layer SCL through a contact hole sequentially passing through the interlayer insulating layer ILD and the gate insulating layer GI.

A passivation layer PSV may be disposed on the thin film transistor TFT.

The passivation layer PSV may include at least one layer. In an exemplary embodiment, for example, the passivation layer PSV may include at least one of an inorganic passivation layer and an organic passivation layer. In an exemplary embodiment, for example, the passivation layer PSV may include an inorganic passivation layer covering the thin film transistor TFT and an organic passivation layer disposed on the inorganic passivation layer.

The inorganic passivation layer may include at least one of silicon oxide and silicon nitride. In addition, the organic passivation layer may include an organic insulating material capable of transmitting light. In an exemplary embodiment, for example, the organic passivation layer may include at least one of polyacrylates resin, epoxy resin, phenolic resin, polyamide resin, polyimide resin, unsaturated polyesters resin, poly-phenylene ethers resin, poly-phenylene sulfides resin, and benzocyclobutene resin.

The light emitting element OLED may be disposed on the passivation layer PSV. The light emitting element OLED may include first and second electrodes EL1 and EL2 and a light emitting layer EML disposed between the two electrodes EL1 and EL2. Here, any one of the first and second electrodes EL1 and EL2 may be an anode electrode, and the other may be a cathode electrode. In an exemplary embodiment, for example, the first electrode EL1 may be the anode electrode and the second electrode EL2 may be the cathode electrode. If the light emitting element OLED is a front emission type organic light emitting element, the first electrode EL1 may be a reflective electrode and the second electrode EL2 may be a transmissive electrode. Here, a case where the light emitting element OLED is a front emission type organic light emitting element and the first electrode EL1 is an anode electrode will be described as an example.

The first electrode EL1 may be connected to the drain electrode DE of the thin film transistor TFT through a contact hole passing through the passivation layer PSV. The first electrode EL1 may include a reflective film (not illustrated) capable of reflecting light and a transparent conductive film (not illustrated) disposed on an upper or lower portion of the reflective film. At least one of the transparent conductive film and the reflective film may be connected to the drain electrode DE.

In an exemplary embodiment, a pixel defining layer PDL which defines an opening exposing a portion of the first electrode EL1 (e.g., an upper surface of the first electrode EL1) may be disposed on the passivation layer PSV.

The pixel defining layer PDL may include an organic insulating material. In an exemplary embodiment, for example, the pixel defining layer PDL may include at least one of polystyrene, polymethylmethacrylate ("PMMA"), polyacrylonitrile ("PAN"), polyamide ("PA"), polyimide ("PI"), polyarylether ("PAE"), heterocyclic polymer, parylene, epoxy, benzocyclobutene ("BCB"), siloxane based resin, and silane based resin.

The light emitting layer EML may be disposed on the exposed surface of the first electrode EL1.

The light emitting layer EML may include a low-molecular material or a high-molecular material. In the exemplary embodiment of the invention, the low-molecular material may include copper phthalocyanine ("CuPc"), N, N-di (naphthalen-1-yl)-N, N'-diphenyl-benzidine (N, N'-Di (naphthalene-1-yl)-N, N'-diphenyl-benzidine: NPB), tris-8-hydroxyquinoline aluminum ("Alq3"), and the like. The polymer material may include PEDOT, poly-phenylenevinylene ("PPV"), polyfluorene, and the like.

The light emitting layer EML may be provided as a single layer, or as multiple layers including various functional layers. If the light emitting layer EML is provided as multiple layers, the light emitting layer may have a hole injecting layer, a hole transport layer, an emission layer, an electron transport layer or an electron injection layer, or may have a composite structure in which those are laminated. The light emitting layer EML according to the invention is not necessarily limited to these exemplary embodiments, and may have various structures. In addition, at least a part of the light emitting layer EML may be integrally formed over a plurality of first electrodes EL1, and may be provided individually corresponding to each of the plurality of first electrodes EL1. A color of the light emitted from the light emitting layer EML may be one of red, green, blue, and white, but the invention is not limited thereto. In another exemplary embodiment, for example, the color of light generated in a light generation layer of the light emitting layer EML may be one of magenta, cyan, and yellow.

The second electrode EL2 may be disposed on the light emitting layer EML. The second electrode EL2 may be a transflective film. In an exemplary embodiment, for example, the second electrode EL2 may be a thin metal layer having a thickness enough to transmit light emitted from the light emitting layer EML. The second electrode EL2 may transmit a part of light emitted from the light emitting layer EML and reflect the remaining light emitted from the light emitting layer EML.

The sealing member SLM may be disposed on the light emitting element OLED.

The sealing member SLM may include a single layer or multiple layers. In the exemplary embodiment of the invention, the sealing member SLM may include first to third sealing layers SLM1, SLM2, and SLM3. The first to third sealing layers SLM1, SLM2 and SLM3 may consist of an organic material and/or an inorganic material. The third sealing layer SLM3 located at the outermost periphery of the sealing member SLM may consist of an inorganic material.

In an exemplary embodiment of the invention, the first sealing layer SLM1 may be a first inorganic layer containing an inorganic material. The second sealing layer SLM2 may be an organic layer containing an organic material. The third sealing layer SLM3 may be a second inorganic layer containing an inorganic material. Hereinafter, for the sake of convenient description, the first sealing layer SLM1 will be referred to as the first inorganic layer, the second sealing layer SLM2 will be referred to as an organic layer, the third sealing layer SLM3 will be referred to as the second inorganic layer.

Here, the sealing member SLM is illustrated as a triple layer including the first inorganic layer SLM1, the organic layer SLM2, and the second inorganic layer SLM3, but the invention is not limited thereto. In another exemplary embodiment, for example, the sealing member SLM may further include at least one organic layer and at least one inorganic layer which are provided between the first inorganic layer SLM1 disposed directly on the light emitting element OLED and the second inorganic layer SLM3 disposed as the outermost portion of the sealing member SLM.

For the inorganic material, penetration of moisture or oxygen may be less than that of the organic material, but the inorganic material may be vulnerable to a crack due to less elasticity or flexibility. If the first inorganic layer SLM1 and the second inorganic layer SLM3 include inorganic materials and the organic layer SLM2 include an organic material, the crack of the inorganic material may be prevented from being propagated. Here, if the organic layer SLM2 includes an organic material, an end portion of the organic layer SLM2 may be completely covered by the second inorganic layer SLM3 without being exposed to the outside. In an exemplary embodiment, the organic material may include an organic insulating material such as a polyacrylic compound, a polyimide compound, a fluorocarbon compound such as teflon, a benzocyclobutene compound, or the like. The inorganic material may include polysiloxane, silicon nitride, silicon oxide, silicon oxynitride, and the like.

In an exemplary embodiment of the invention, the light emitting layer EML of the light emitting element OLED may be easily damaged by moisture or oxygen from the outside. The sealing member SLM protects the light emitting layer EML by covering the light emitting layer EML.

The sealing member SLM may further include a surface modification layer SAM and a lens portion LSP.

The surface modification layer SAM may be disposed on the first inorganic layer SLM1. The surface modification layer SAM may include a material having surface energy different from surface energy of the first inorganic layer SLM1. For example, the surface modification layer SAM may include a self-assembled organic material. The self-assembled organic material may include self-assembled monomer and self-assembled polymer. In an exemplary embodiment of the invention, the self-assembled organic material may include the self-assembled monomer.

The self-assembled monomer may be a layer in which molecules having a relatively long alkyl group and molecules having a functional group capable of covalently bonding with a surface of a substrate at a terminal thereof are uniformly aligned on the surface of the substrate, using a self-assembly phenomenon in which appropriate molecules are aligned two-dimensionally on the surface of the substrate. In the exemplary embodiment of the invention, the substrate may be the first inorganic layer SLM1.

The self-assembled monomer may have a hydrophobic property or a hydrophilic property depending on a type of a material deposited on a surface. In an exemplary embodiment of the invention, the surface modification layer SAM may include the self-assembled monomer having a hydrophobic property.

The surface modification layer SAM may have a form corresponding to the second electrode EL2 and the first inorganic layer SLM1. The second electrode EL2 and the first inorganic layer SLM1 may have a stepped portion due to the opening defined by the pixel defining layer PDL. That is, the second electrode EL2 and the first inorganic layer SLM1 may have a stepped portion corresponding to the opening. Accordingly, the surface modification layer SAM may have a stepped portion corresponding to the stepped portion of the first inorganic layer SLM1 disposed under the surface modification layer SAM.

The lens portion LSP may be provided between the surface modification layer SAM and the organic layer SLM2. In addition, the lens portion LSP may be provided in the stepped portion of the surface modification layer SAM so as to correspond to the opening of the pixel defining layer PDL.

The lens portion LSP and the organic layer SLM2 disposed on the lens portion LSP may have different refractive indices from each other. Accordingly, the lens portion LSP may improve efficiency of light by diffusing or condensing light generated in the light emitting element OLED using a refractive index difference between the lens portion LSP and the organic layer SLM2. In an exemplary embodiment of the invention, the lens portion LSP may have a refractive index of about 1.5 to about 2.0, but the invention is not limited thereto.

The lens portion LSP may be formed of ink including an epoxy resin. The lens portion LSP may be provided on the surface modification layer SAM using an ink jet printing method or the like. A method of forming the lens portion LSP using the ink jet printing method may be as follows. To begin with, the ink is ejected onto the surface modification layer SAM through a nozzle of the ink jet printing apparatus. In this case, the ink may keep a bead shape on a surface of the surface modification layer SAM without being spread due to the hydrophobic surface property of the surface modification layer SAM. The ink of the bead shape may be deposited in the stepped portion of the surface modification layer SAM. Subsequently, the ink deposited on the stepped portion may be cured, and thereby, the lens portion LSP having the bead shape may be provided on the surface modification layer SAM. As a result, the lens portion LSP may have a convex shape due to the hydrophobic surface property of the surface modification layer SAM.

In general, the display device includes the thin film transistor TFT, the light emitting element OLED, and the sealing member SLM which covers the thin film transistor TFT and the light emitting element OLED. Optical characteristics of the display device may be degraded in the laminated structure.

Particularly, if the sealing member SLM disposed on the light emitting element OLED has a multilayer structure as described above, a part of light emitted from the light emitting element OLED may be constrained in the inside of the multilayer structure by internal total reflection to be eliminated. In this case, the efficiency of light of the display device may decrease.

Accordingly, in an exemplary embodiment of the invention, the lens portion LSP may be arranged in the sealing member SLM so as to condense or diffuse light emitted from the light emitting element OLED, and thereby, light extraction efficiency may be improved. In this case, the efficiency of light of the display device may be improved. To this end, the lens portion LSP may include a material having a refractive index which is different from that of the organic layer SLM2 disposed on the lens portion LSP.

Figure 4A:
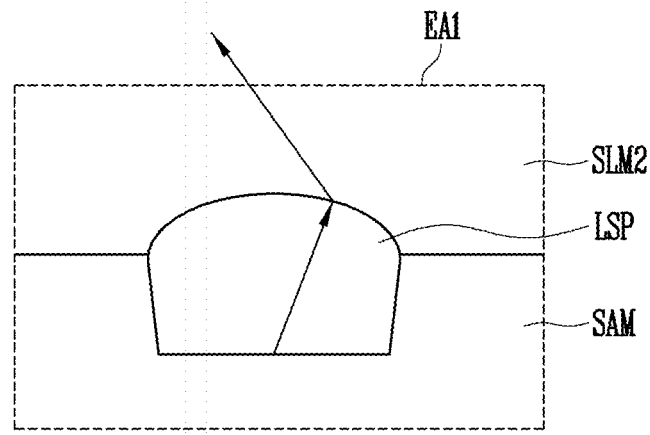
FIGS. 4A and 4B are enlarged views of a portion EA1 of FIG. 3.
Figure 4B:
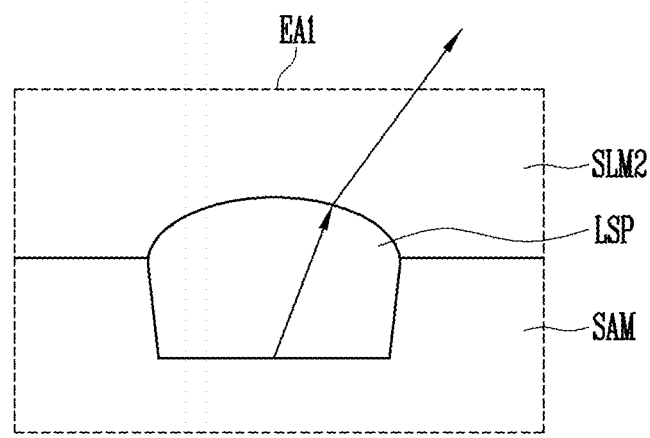

FIGS. 4A and 4B are enlarged view of a portion EA1 of FIG. 3.

Referring to FIGS. 3 and 4a, the organic layer SLM2 may be disposed on the lens portion LSP having the convex shape. The lens portion LSP may have a larger refractive index than the organic layer SLM2. In an exemplary embodiment, for example, the lens portion LSP may have a refractive index of approximately 1.6 to 2.0, and the organic layer SLM2 may have a refractive index of approximately 1.5 to 1.8.

If the lens portion LSP is convex and has a refractive index larger than a refractive index of the organic layer SLM2, light passing through the lens portion LSP may be refracted far from a vertical normal line at a boundary between the lens portion LSP and the organic layer SLM2. In this case, light traveling to the organic layer SLM2 may be condensed to improve the light extraction effects.

Referring to FIGS. 3 and 4B, the organic layer SLM2 may be disposed on the lens portion LSP having the convex shape. The lens portion LSP may have a smaller refractive index than the organic layer SLM2. In an exemplary embodiment, for example, the lens portion LSP may have a refractive index of approximately 1.5 to 1.8, and the organic layer SLM2 may have a refractive index of approximately 1.6 to 2.0.

If the lens portion LSP is convex and has a refractive index smaller than a refractive index of the organic layer SLM2, light passing through the lens portion LSP may be refracted toward the vertical normal line at the boundary between the lens portion LSP and the organic layer SLM2. In this case, light traveling to the organic layer SLM2 may be diffused, thereby improving the light extraction effects.

As a result, if the lens portion LSP having the convex shape is disposed in the sealing member SLM, the light extraction effects may be improved by using the refractive index difference between the lens portion LSP and the organic layer SLM2. As a result, the efficiency of light of the display device according to the exemplary embodiment of the invention may be improved.

FIGS. 5A to 5E are sectional views illustrating an exemplary embodiment of a method of forming the sealing member in the display device of FIG. 3.

Figure 5A:
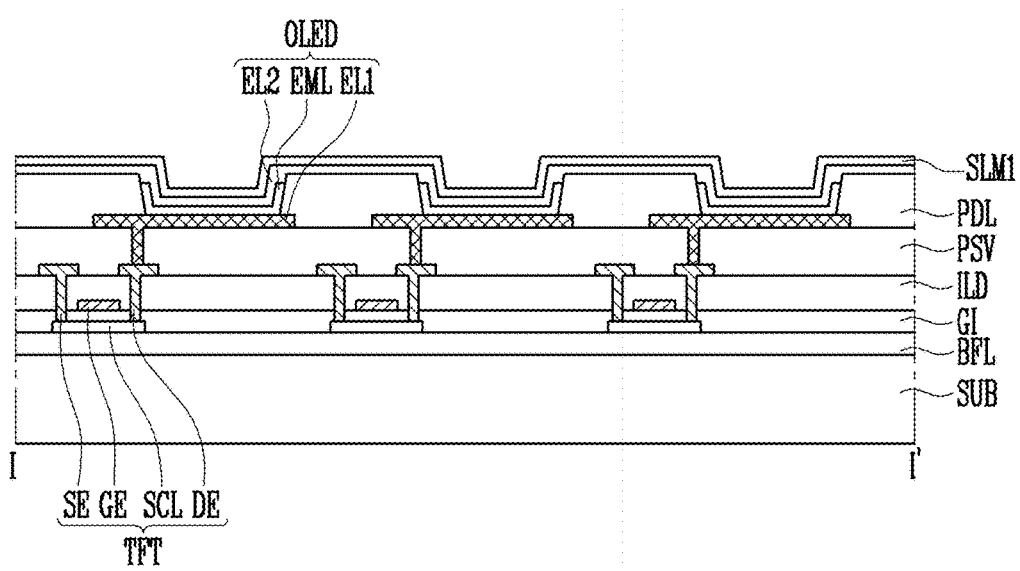
FIGS. 5A to 5E are sectional views of illustrating exemplary embodiment of a method of forming a sealing member in the display device of FIG. 3.

Referring to FIGS. 3 and 5A, the first inorganic layer SLM1 is formed on the substrate SUB provided with the thin film transistor TFT and the light emitting element OLED. The first inorganic layer SLM1 may consist of an inorganic insulating material containing an inorganic material. For the inorganic material, penetration of moisture or oxygen may be less than that of the organic material, but the inorganic material may be vulnerable to a crack due to less elasticity or flexibility. In an exemplary embodiment, a material which is usable as the first inorganic layer SLM1 may include at least one of silicon nitride, aluminum nitride, zirconium nitride, titanium nitride, hafnium nitride, tantalum nitride, silicon oxide, aluminum oxide, and titanium oxide. In addition, any inorganic material known in the art may be used as a material of the first inorganic layer SLM1.

Figure 5B:
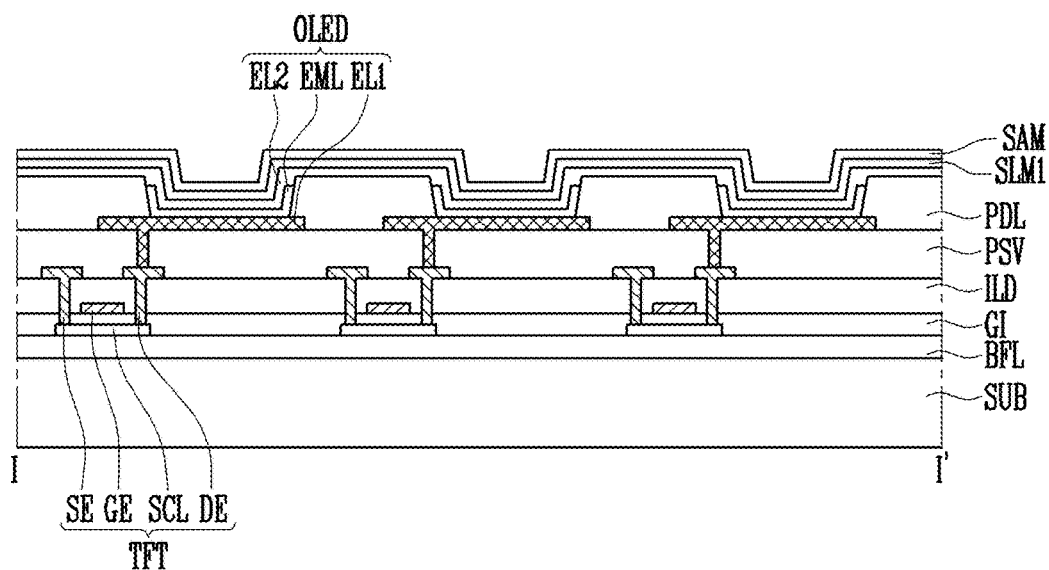

Subsequently, referring to FIGS. 3 and 5B, the surface modification layer SAM is formed on the first inorganic layer SLM1. The surface modification layer SAM may be a very thin layer and may have a thickness of several angstroms. The surface modification layer SAM may be a layer having a hydrophobic self-assembled monomer and be formed on the first inorganic layer SLM1 using various methods. In an exemplary embodiment, for example, the surface modification layer SAM may be formed by coating the first inorganic layer SLM1 with an inorganic material. At this time, roughness of the surface of the inorganic material may be controlled.

Here, the first inorganic layer SLM1 and the surface modification layer SAM may have a shape corresponding to a shape of the second electrode EL2 disposed under the first inorganic film SLM1 and the surface modification layer SAM. In the exemplary embodiment of the invention, the second electrode EL2 may have a stepped portion due to an opening defined by the pixel defining layer PDL. Accordingly, the second electrode EL2 may have the stepped portion corresponding to the opening. As a result, the first inorganic layer SLM1 and the surface modification layer SAM may also have stepped portions corresponding to the opening defined by the pixel defining layer PDL.

Figure 5C:
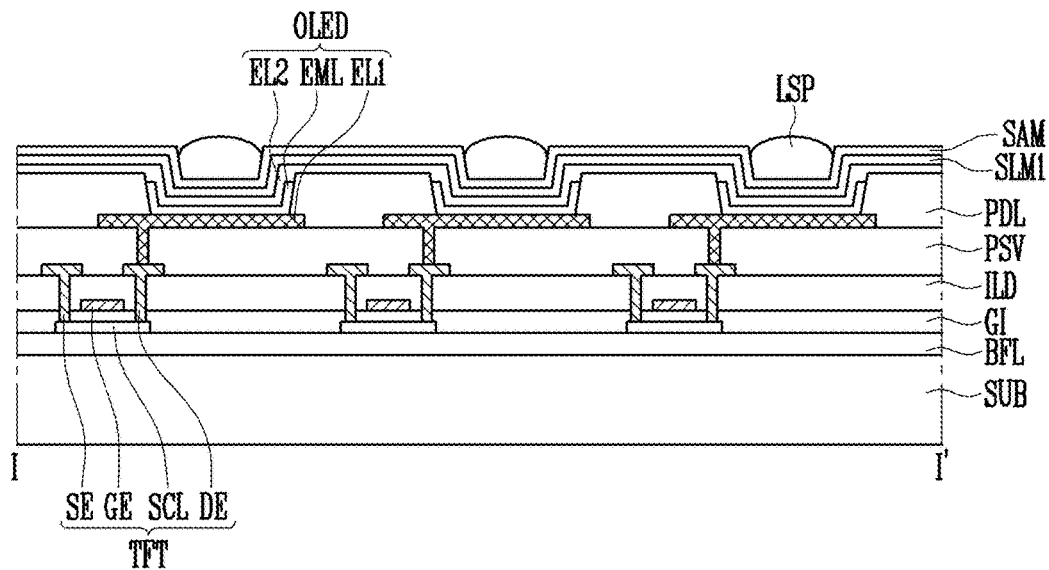

Referring to FIGS. 3 and 5C, the lens portion LSP is formed on the surface modification layer SAM. The lens portion LSP may be formed on the surface modification layer SAM using an ink jet printing method or the like.

Specifically, ink containing an epoxy-based resin is injected into a nozzle of an ink jet printing apparatus, and the ink is ejected onto the surface modification layer SAM using the nozzle. At this time, when the ink is ejected onto the surface modification layer SAM using the nozzle, a one point-one drop method, a one point-one spray method, etc. may be used. In the one point-one drop method, the ink is dropped once at one point, and thus, accuracy may be high but the productivity may be low. In the one point-one spray method, a large amount of ink is dropped at one point at a time, and thus, accuracy may be low, but productivity may be high.

If the ink is ejected onto the surface modification layer SAM using the above-described method or the like, the ink may keep a bead shape without being spread on the surface modification layer SAM due to a hydrophobic surface property of the surface modification layer SAM. The ink having the bead shape may be deposited in the stepped portion of the surface modification layer SAM. The ink deposited on the stepped portion of the surface modification layer SAM may be cured to form the lens portion LSP on the surface modification layer SAM.

Figure 5D:
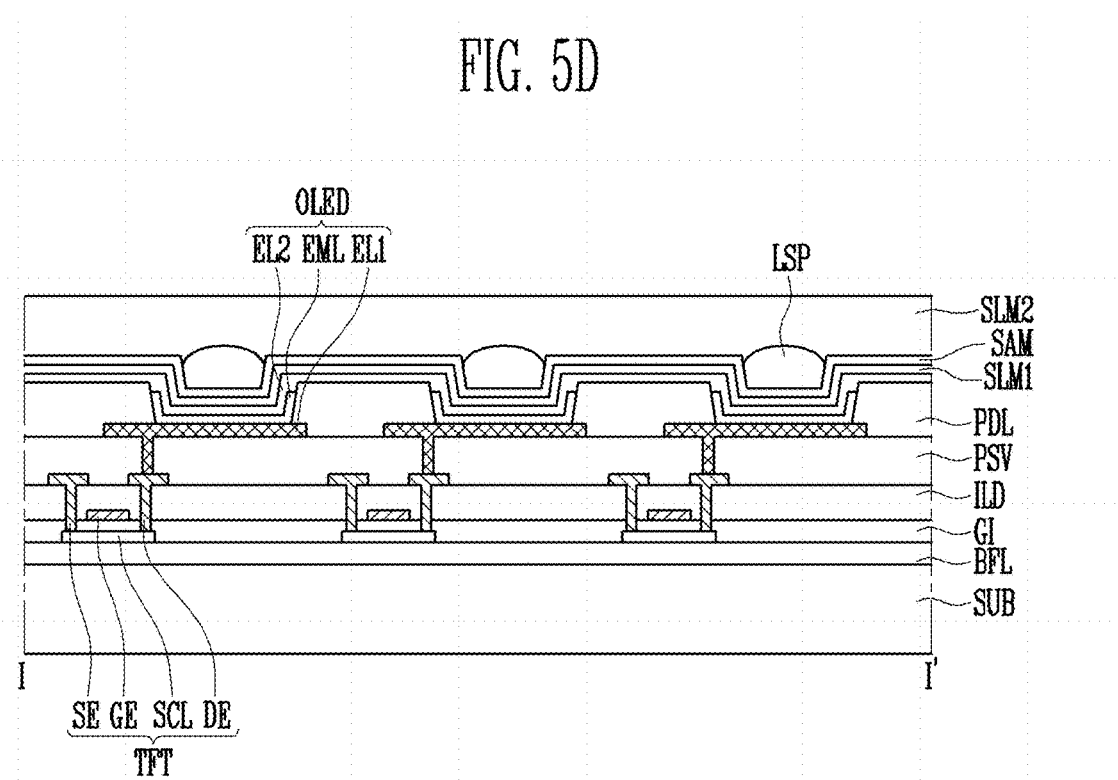

Subsequently, referring to FIGS. 3 and 5D, the organic layer SLM2 is formed on the lens portion LSP. The organic layer SLM2 may include an organic insulating material including an organic material which is advantageous in terms of flexibility and elasticity compared to the first inorganic layer SLM2. The organic material may include a polyacrylic compound, a polyimide compound, a fluorocarbon compound such as teflon, a benzocyclobutene compound, and the like. In addition, any organic material known in the art may be used as a material of the organic layer SLM2.

Figure 5E:
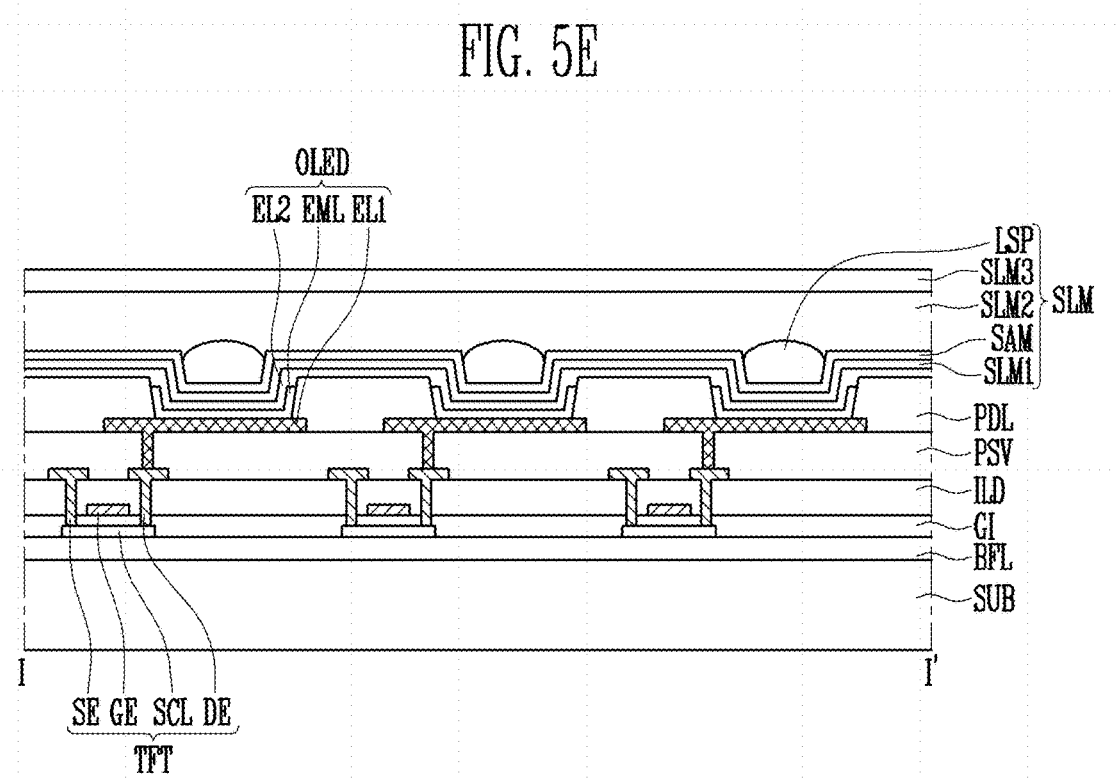

Referring to FIGS. 3 and 5E, the second inorganic layer SLM3 is formed on the organic layer SLM2. The second inorganic layer SLM3 may consist of an inorganic insulating material containing an inorganic material. The second inorganic layer SLM3 may include the same material as the first inorganic layer SLM1.

Figure 6A:
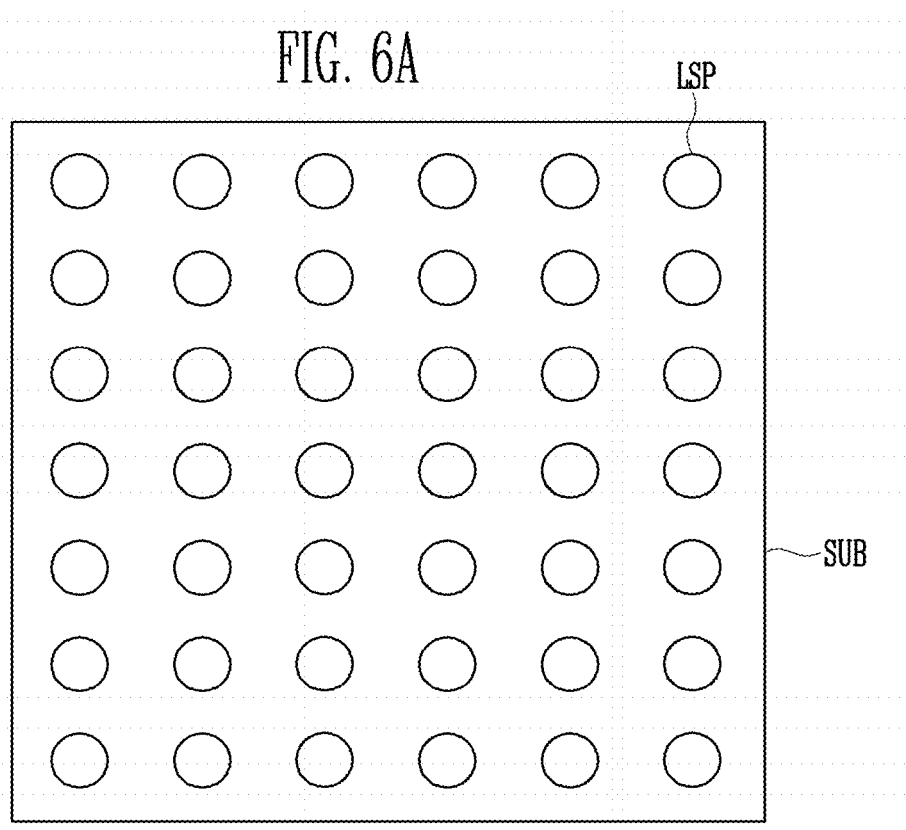
FIGS. 6a and 6B are plan views illustrating an exemplary embodiment of an arrangement structure of lens units according to the invention.
Figure 6B:
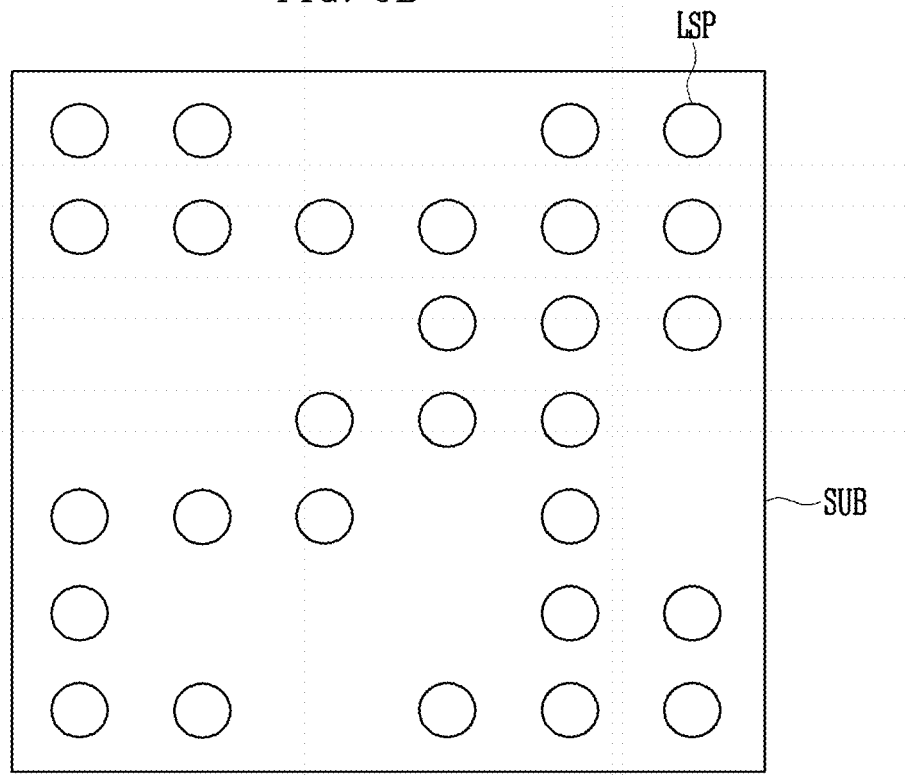

FIGS. 6A and 6B are plan views illustrating an exemplary embodiment of an arrangement structure of the lens portion according to the invention. In FIGS. 6A and 6B, a plurality of thin film transistors and a plurality of light emitting elements are arranged on the substrate, but illustration of the thin film transistors and the light emitting elements is omitted for the sake of convenient description. The lens portion may be disposed on each light emitting element, but the invention is not limited thereto. In another exemplary embodiment, for example, the lens portion may be disposed only on some of the plurality of light emitting elements.

In order to further improve efficiency of light emitted from the light emitting element, the lens portions may be arranged at various positions and/or various density per unit area depending on the position in conjunction with an image displayed in the display region of the substrate. In an exemplary embodiment, for example, if there is a region (hereinafter, referred to as a 'first region') in which display of an image is concentrated and a region (hereinafter, referred to as a 'second region') in which the display of an image is not concentrated, in a display region of the substrate, lots of lens portions may be arranged in the first region and a smaller number of lens portions than in the first region may be arranged in the second region so as to improve the efficiency of light of the first region.

However, the invention is not limited thereto. In another exemplary embodiment, for example, in order to make the efficiency of light of the second region and the efficiency of light of the first region uniform, lots of the lens portions may be arranged in the second region, and the smaller number of lens portions than in the second region may be arranged in the first region.

As described above, the lens portions may be arranged in different numbers by regions on the substrate depending on effects to be obtained.

Referring to FIG. 6A, a plurality of lens portions LSP may be regularly arranged on the substrate SUB. In an exemplary embodiment, for example, the lens portions LSP may be uniformly arranged on the substrate SUB such that distances between the lens portions LSP are the same. In addition, the lens portions LSP may be disposed on the substrate SUB to correspond to each of the plurality of pixels (refer to PXL of FIG. 1) provided on the substrate SUB.

Referring to FIG. 6B, the lens portions LSP may be irregularly arranged on the substrate SUB. In an exemplary embodiment, for example, the lens portions LSP may be randomly arranged on the substrate SUB regardless of the distances between the adjacent lens portions LSP.

Figure 7:
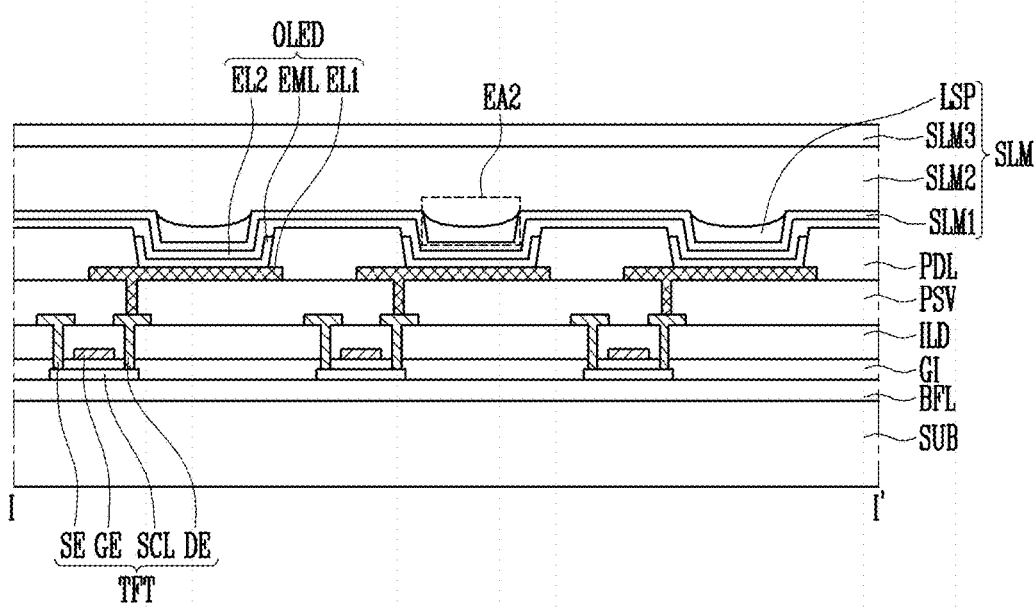
FIG. 7 is a cross-sectional view of another exemplary embodiment of a display device according to the invention, taken along line I-I' of FIG. 1.

FIG. 7 is a cross-sectional view of another exemplary embodiment of a display device according to the invention, taken along line I-I' of FIG. 1. Here, differences from the above-described exemplary embodiments will be mainly described in order to avoid redundant description. Parts not specifically described in this exemplary embodiment are according to the above-described exemplary embodiments, the same numbers denote the same configuration elements, and the similar numbers denote the similar configuration elements.

Referring to FIG. 7, the display device according to another exemplary embodiment of the invention may include a substrate SUB, a thin film transistor TFT, a light emitting element OLED, and a sealing member SLM.

The sealing member SLM may be disposed on the light emitting element OLED.

The sealing member SLM may include a single layer or multiple layers. In an exemplary embodiment of the invention, the sealing member SLM may include a first inorganic layer SLM1, an organic layer SLM2, and a second inorganic layer SLM3. The first and second inorganic layers SLM1 and SLM3 may consist of an inorganic material. The organic layer SLM2 may include an organic material.

In an exemplary embodiment of the invention, the light emitting layer EML of the light emitting element OLED may be easily damaged by moisture or oxygen from the outside. The sealing member SLM may cover the light emitting layer EML to protect the light emitting element OLED.

The sealing member SLM includes the lens portion LSP.

The lens portion LSP may be disposed between the first inorganic layer SLM1 and the organic layer SLM2. In an exemplary embodiment of the invention, the first inorganic layer SLM1 may be provided in a shape corresponding the opening defined by the pixel defining layer PDL provided under the light emitting element OLED. The pixel defining layer PDL may define an opening which exposes a part of the first electrode EL1 of the light emitting element OLED, and thereby, the first inorganic layer SLM1 may also include a stepped portion corresponding to the opening.

The lens portion LSP and the organic layer SLM2 disposed thereon may have different refractive indices from each other. Accordingly, the lens portion LSP may improve efficiency of light by diffusing or condensing light generated in the light emitting element OLED using a refractive index difference between the lens portion LSP and the organic layer SLM2.

The lens portion LSP may be formed of ink containing an epoxy-based resin. The lens portion LSP may be formed by injecting the ink into a nozzle of an ink jet printing apparatus, and thereafter, ejecting the ink onto the first inorganic layer SLM1 and curing the ink. At this time, the ink may have a hydrophilic property with respect to the first inorganic layer SLM1. Accordingly, the ink spreads widely on a surface of the first inorganic layer SLM1, thereby being deposited also in the stepped portion of the first inorganic layer SLM1. Particularly, the ink deposited in the stepped portion of the first inorganic layer SLM1 may have a concave shape due to a surface tension with the first inorganic layer SLM1.

Figure 8A:
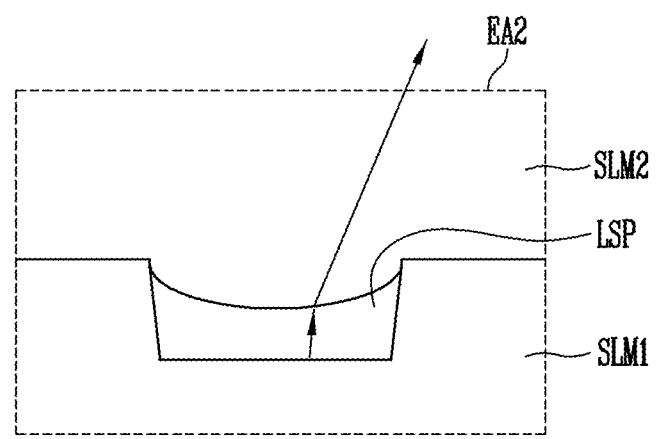
FIGS. 8A and 8B are enlarged views of a portion EA2 of FIG. 7.
Figure 8B:
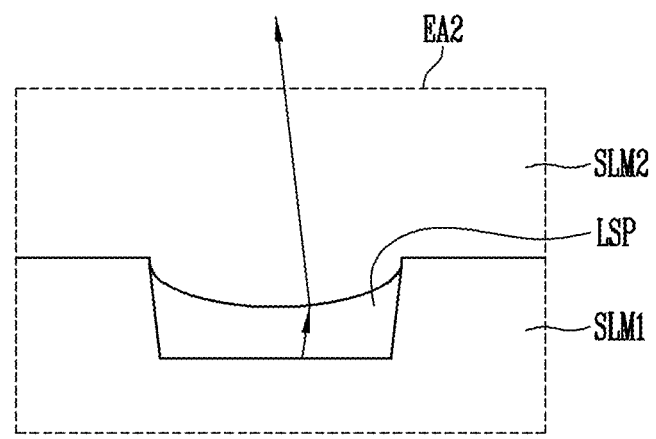

FIGS. 8A and 8B are enlarged views of a portion EA2 of FIG. 7.

Referring to FIGS. 7 and 8A, the organic layer SLM2 may be disposed on the lens portion LSP having the concave shape. The lens portion LSP may have a larger refractive index than a refractive index of the organic layer SLM2. In an exemplary embodiment, for example, the lens portion LSP may have a refractive index of approximately 1.6 to 2.0, and the organic layer SLM2 may have a refractive index of approximately 1.5 to 1.8.

If the lens portion LSP has a concave shape and has a refractive index larger than a refractive index of the organic layer SLM2, light passing through the lens portion LSP may be refracted far from a vertical normal line at a boundary between the lens portion LSP and the organic layer SLM2. In this case, light traveling to the organic layer SLM2 may be diffused to improve the light extraction effects.

Referring to FIGS. 7 and 8B, the organic layer SLM2 may be disposed on the lens portion LSP having the concave shape. The lens portion LSP may have a smaller refractive index than a refractive index of the organic layer SLM2. In an exemplary embodiment, for example, the lens portion LSP may have a refractive index of approximately 1.5 to 1.8, and the organic layer SLM2 may have a refractive index of approximately 1.6 to 2.0.

If the lens portion LSP has a concave shape and has a refractive index smaller than a refractive index of the organic layer SLM2, light passing through the lens portion LSP may be refracted toward the vertical normal line at the boundary between the lens portion LSP and the organic layer SLM2. In this case, the light traveling to the organic layer SLM2 may be condensed to improve the light extraction effects.

As a result, if the lens portion LSP having the concave shape is disposed in the sealing member SLM, The extraction effects of light emitted from the light emitting element OLED may be improved by using the refractive index difference between the lens portion LSP and the organic layer SLM2. Thus, it is possible to improve the efficiency of light of the display device according to the exemplary embodiment of the invention.

FIGS. 9A to 9D are sectional views of illustrating an exemplary embodiment of a method of forming the sealing member in the display device of FIG. 7.

Figure 9A:
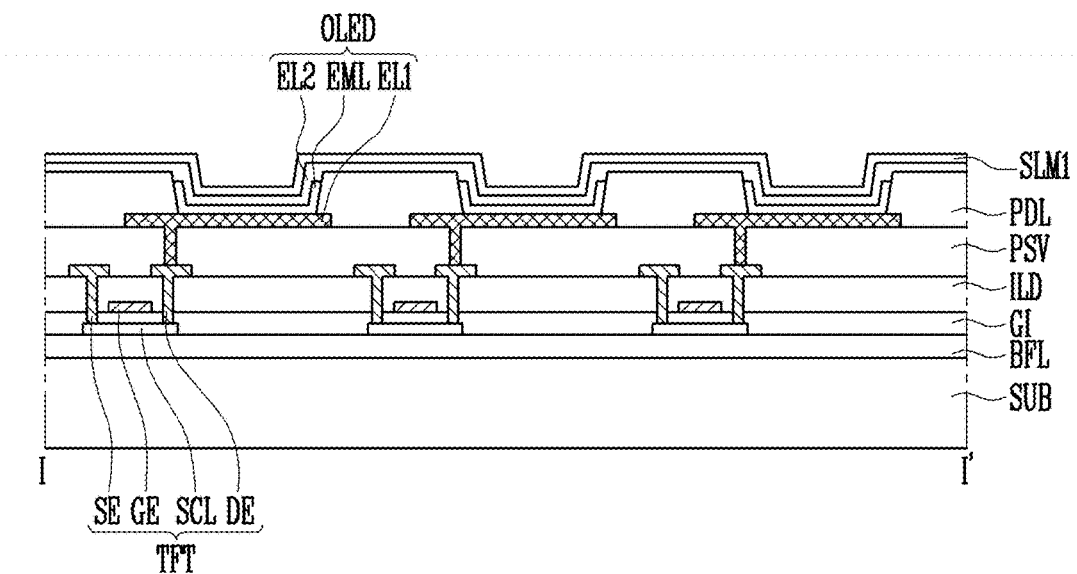
FIGS. 9A to 9D are sectional views illustrating an exemplary embodiment of a method of forming a sealing member in the display device of FIG. 7.

Referring to FIGS. 7 and 9A, the first inorganic layer SLM1 is formed on the substrate SUB provided with the thin film transistor TFT and the light emitting element OLED. The first inorganic layer SLM1 may consist of an inorganic insulating material containing an inorganic material. At this time, the first inorganic layer SLM1 may be provided as a shape corresponding to the opening defined by a pixel defining layer PDL provided under the light emitting element OLED. Accordingly, the first inorganic layer SLM1 may include the stepped portion corresponding to the opening defined by the pixel defining layer PDL.

Figure 9B:
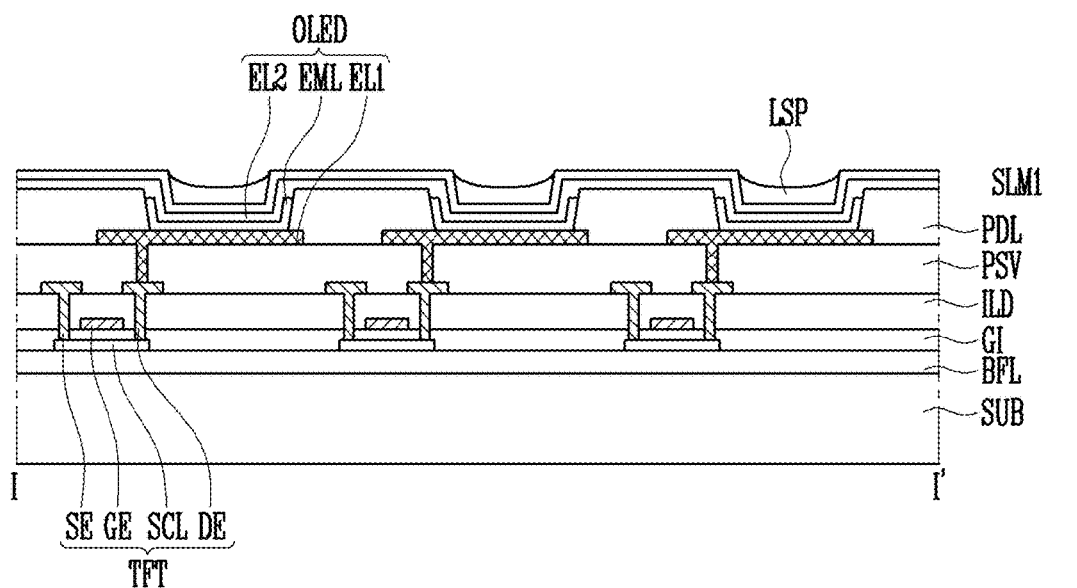

Subsequently, referring to FIGS. 7 and 9B, the lens portion LSP is formed on the first inorganic layer SLM1. The lens portion LSP may be formed on the first inorganic layer SLM1 using an ink jet printing method or the like. At this time, the lens portion LSP is provided in the stepped portion of the first inorganic layer SLM1 and may have a concave shape due to the surface tension with the first inorganic layer SLM1.

Figure 9C:
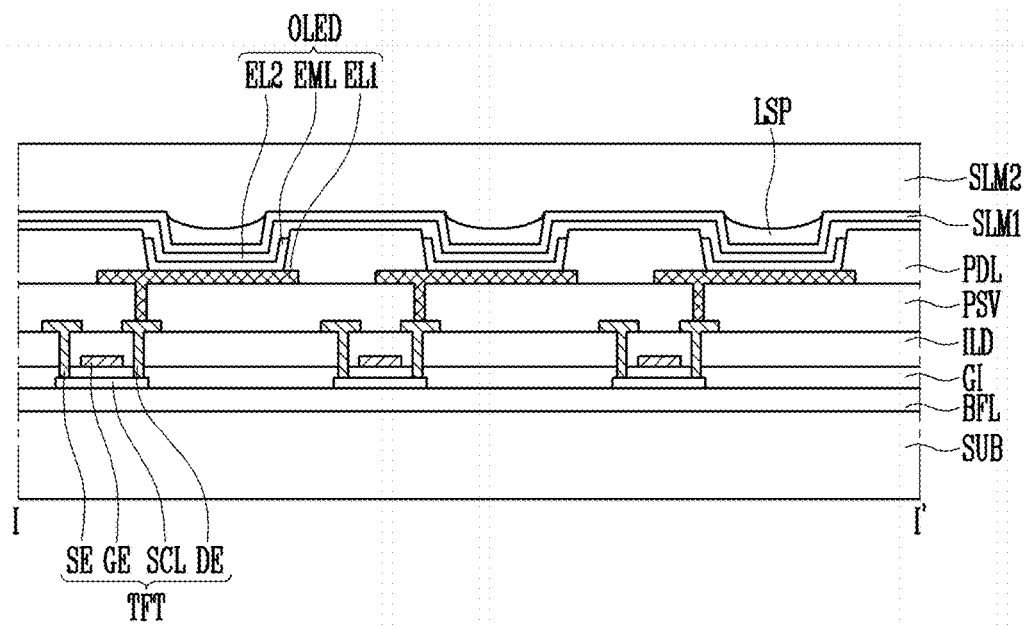

Subsequently, referring to FIGS. 7 and 9C, the organic layer SLM2 is formed on the lens portion LSP. The organic layer SLM2 may include an organic material which is advantageous in terms of flexibility and elasticity compared to the first inorganic layer SLM2.

Figure 9D:
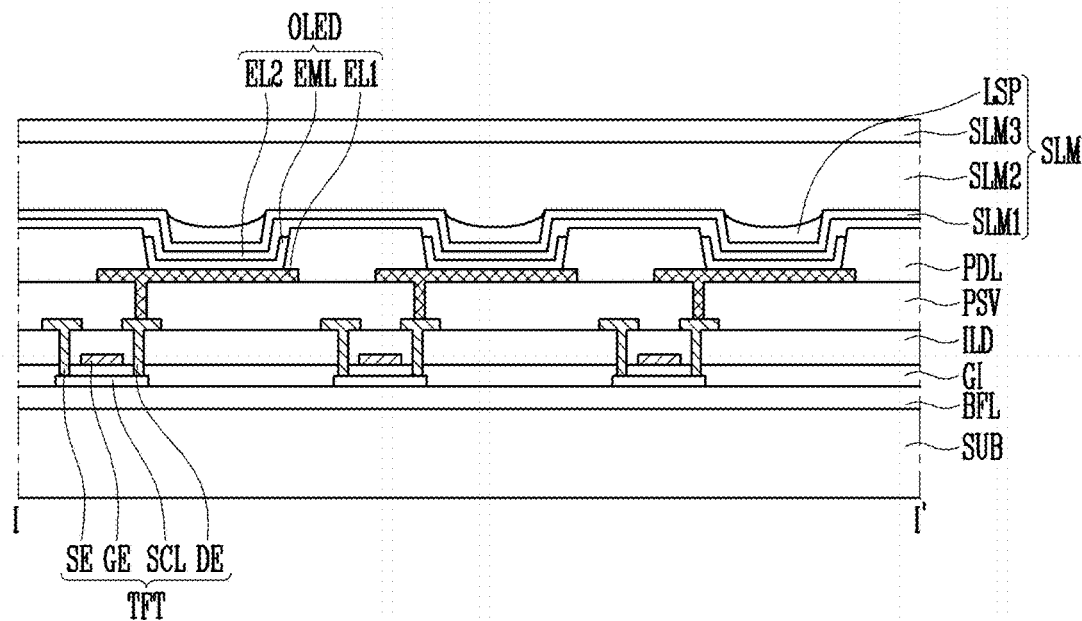

Referring to FIGS. 7 and 9D, the second inorganic layer SLM3 is formed on the organic layer SLM2. The second inorganic layer SLM3 may consist of an inorganic insulating material containing an inorganic material. The second inorganic layer SLM3 may include the same material as the first inorganic layer SLM1.

The display device according to the exemplary embodiment of the invention may be employed in various electronic apparatuses. In an exemplary embodiment, for example, the display device may be applied to a television, a notebook computer, a mobile phone, a smart phone, a smart pad ("PD"), a PMP, a PDA, a navigation device, various wearable devices such as a smart watch, and the like.

Although the invention is described with reference to preferred exemplary embodiments, those skilled in the art or those having ordinary knowledge in the art may understand that the invention can be modified and changed in various forms in a range without departing from the spirit and technical scope of the invention described in the Claims which will be described below.

Therefore, the technical scope of the invention should not be limited to the contents described in the detailed description of the specification, but should be defined by the Claims.

What is claimed is:

1. A display device comprising:
   a substrate which includes a pixel region and a peripheral region which is provided on at least one side of the pixel region;
   a plurality of pixels provided in the pixel region;
   a passivation layer disposed on the substrate;
   a light emitting element disposed on the passivation layer and which emits light;
   a pixel defining layer disposed on the passivation layer and which defines an opening which exposes a part of the light emitting element; and
   a sealing member which covers the light emitting element,
   wherein the sealing member includes:
      a first inorganic layer disposed on the light emitting element;
      a lens portion disposed on the first inorganic layer and which corresponds to the opening defined by the pixel defining layer and extracts light which is emitted from the light emitting element;
      an organic layer disposed on the lens portion; and
      a second inorganic layer disposed on the organic layer, and wherein the lens portion and pixel defining layer do not overlap.

2. The display device according to claim 1, further comprising:
   a surface modification layer disposed between the first inorganic layer and the lens portion.

3. The display device according to claim 2, wherein the surface modification layer includes a self-assembled organic material with a hydrophobic property.

4. A display device comprising:
a substrate which includes a pixel region and a peripheral region which is provided on at least one side of the pixel region;
a plurality of pixels provided in the pixel region;
a passivation layer disposed on the substrate;
a light emitting element disposed on the passivation layer and which emits light, a portion of the light emitting element being disposed through an opening, defined by a pixel defining layer disposed on the passivation layer; and
a sealing member which covers the light emitting element,
wherein the sealing member includes:
a first inorganic layer disposed on the light emitting element;
a lens portion disposed on the first inorganic layer and which extracts light which is emitted from the light emitting element;
an organic layer disposed on the lens portion; and
a second inorganic layer disposed on the organic layer,
wherein the lens portion and pixel defining layer do not overlap.

5. The display device according to claim 4, wherein the lens portion includes ink containing epoxy-based resin.

6. The display device according to claim 4, wherein the lens portions are irregularly arranged on the substrate.

7. The display device according to claim 4, wherein the lens portion has a concave shape.

8. The display device according to claim 4, wherein each of the plurality of pixels includes a thin film transistor which is provided on the substrate and is electrically connected to the light emitting element.

9. The display device according to claim 8, wherein the thin film transistor includes:
a semiconductor layer disposed on the substrate;
a gate electrode disposed on the semiconductor layer with a gate insulating layer interposed therebetween; and
a source electrode and a drain electrode connected to the semiconductor layer.

10. The display device according to claim 4, wherein the lens portions are regularly arranged on the substrate.

11. The display device according to claim 10, wherein the lens portions are arranged to correspond to the plurality of pixels on the substrate, respectively.

12. The display device according to claim 4, wherein the organic layer and the lens portion have different refractive indices from each other.

13. The display device according to claim 12, wherein the refractive index of the organic layer is smaller than the refractive index of the lens portion.

14. The display device according to claim 12, wherein the refractive index of the organic layer is larger than the refractive index of the lens portion.

15. The display device according to claim 1, wherein the light emitting element includes:
a first electrode disposed on the passivation layer;
a light emitting layer disposed on the first electrode through the opening, defined by the pixel defining layer, through which a part of the first electrode is exposed; and
a second electrode disposed on the light emitting layer.

16. The display device according to claim 15, wherein the lens portion is disposed on the first inorganic layer and corresponds to the opening defined by the pixel defining layer.

17. The display device according to claim 16, further comprising:
a surface modification layer disposed between the first inorganic layer and the lens portion.

18. The display device according to claim 17, wherein the surface modification layer includes a self-assembled organic material with a hydrophobic property.

19. The display device according to claim 18, wherein the lens portion has a convex shape.

* * * * *